United States Patent [19]

Broich et al.

[11] Patent Number: 4,862,239
[45] Date of Patent: Aug. 29, 1989

[54] POWER SEMICONDUCTOR COMPONENT

[75] Inventors: Bruno Broich; Horst Grüning, both of Baden, Switzerland

[73] Assignee: BBC Brown Boveri AG, Baden, Switzerland

[21] Appl. No.: 93,607

[22] Filed: Sep. 8, 1987

[30] Foreign Application Priority Data

Sep. 16, 1986 [CH] Switzerland .................. 3707/86

[51] Int. Cl.⁴ .................................. H01L 29/74
[52] U.S. Cl. ........................ 357/38; 357/36; 357/56; 357/65; 357/68; 357/51
[58] Field of Search ............ 357/37, 38, 51, 68, 357/71, 23.8, 36, 55, 56, 59 F, 65, 79

[56] References Cited

U.S. PATENT DOCUMENTS 4,127,863 11/1978 Kurata .................................. 357/38
4,246,596 1/1981 Iwasaki ............................. 357/56 X
4,626,888 12/1986 Nagano et al. ......................... 357/38

FOREIGN PATENT DOCUMENTS 0064231 11/1982 European Pat. Off. ............. 357/38
0064613 11/1982 European Pat. Off. .
0082419 6/1983 European Pat. Off. ............. 357/38
0121068 10/1984 European Pat. Off. .
3346833 7/1984 Fed. Rep. of Germany .
2077332 10/1971 France .

Primary Examiner—Andrew J. James
Assistant Examiner—Sara W. Crane
Attorney, Agent, or Firm—Oblon, Spivak, McClelland, Maier & Neustadt

[57] ABSTRACT

In a power semiconductor component having a so-called "recessed-gate" structure on the cathode side, the large-area control structure consisting of cathode fingers (1) and a lower-lying gate level (2) is divided into a plurality of small-area control zones (25a, 25b) which in each case by themselves are soldered to a cathode block (13a, 13b). This creates high-power components without the possibility of excessive thermal stresses occurring during load cycles.

7 Claims, 2 Drawing Sheets

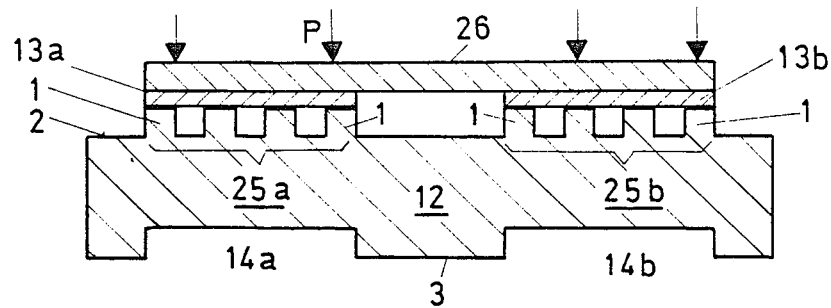
Fig. 4
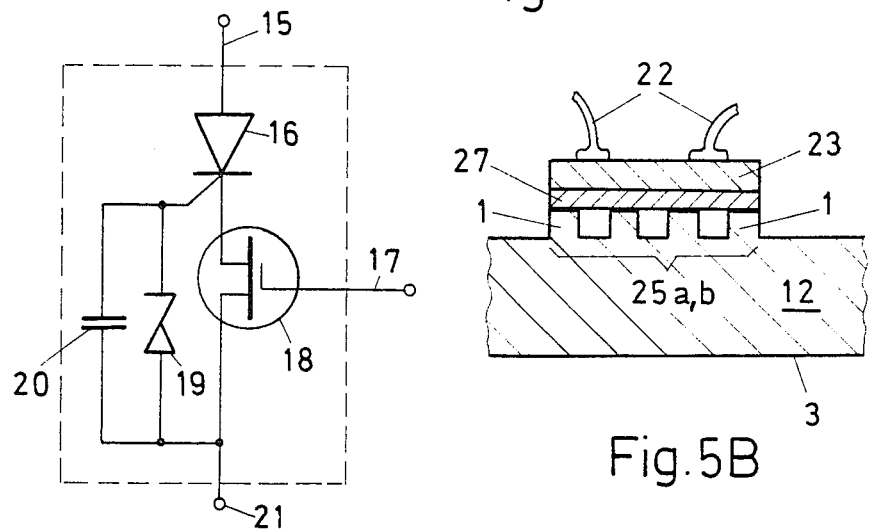
Fig. 5A
Fig. 5B
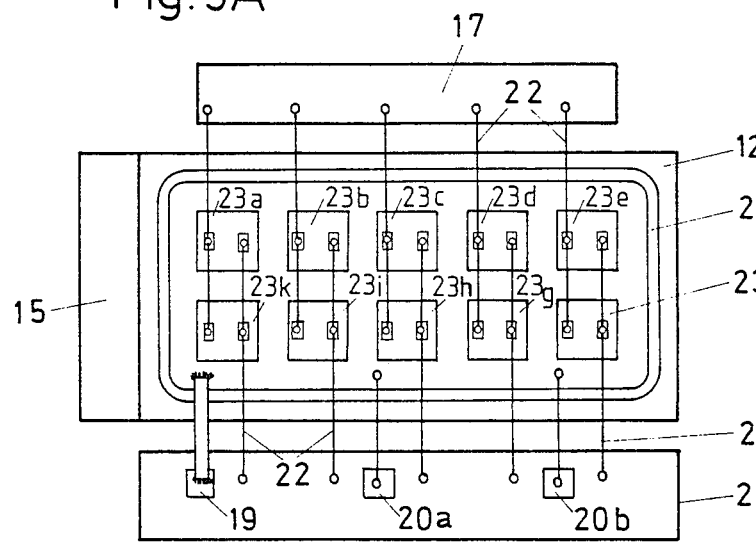
Fig. 5C

POWER SEMICONDUCTOR COMPONENT

TECHNICAL FIELD

The invention relates to power semiconductor components. In particular, it relates to such components having a plurality of differently doped layers which are arranged in a semiconductor substrate between an anode and a cathode, a plurality of narrow cathode fingers on the cathode side, which cathode fingers are offset from a lower-lying gate level, the cathode fingers and the gate level surrounding them forming a large-area step-like control structure.

PRIOR ART

During the installation of high-power and large-area semiconductor components available in the form of semiconductor wafers or tablets, into corresponding cases, problems of various types must be solved with respect to the electrical and thermal contacting which have led to different types of mounting for the components.

Thus, it has long been known to solder large-area power semiconductor components having a comparatively simple structure (for example diodes) on both sides of the semiconductor wafer to metallic plates which match the semiconductor material (Si in most cases) in thermal expansion. In the case of silicon semiconductors, the metallic plates consist in most cases of Mo or W (see for example German Offenlegungsschrift No. 19 49 731).

A technologically more difficult process is the contacting of gate-turn-off (GTO) thyristors which exhibit on the cathode side a finely subdivided control structure consisting of alternating, finger-like cathode areas and intermediate gate areas.

In the case of such GTO components, it is now prior art (see for example German Offenlegungsschrift No. 31 34 074), to solder the thyristor wafer on the anode side as previously to a metallic contact plate. For contacting the cathode-side control structure, a planar pressure contact is here used which, at the same time, is pressed against the metallized surfaces of the cathode and gate areas and thus produces the thermal and electric connection to the semiconductor substrate.

In addition, it is also prior art, to use the so-called direct pressure contact in GTOs (see for example U.S. Pat. No. 4,243,999) in which the thyristor wafer is contacted by means of a pressure contact both on the cathode and on the anode side.

The last described type of pressure contacting, however, encounters great practical difficulties in the case of power semiconductor components having a so-called "recessed-gate" structure since in these components (GTO or FCTh=Field Controlled Thyristor), the cathode-side control structure consists of a plurality of very narrow elongated cathode fingers which project from a gate level surrounding them which is located much deeper (EP-No.A1 0 121 068). For this reason, it would be desirable to equip these components with a solder contact on the cathode side.

As has already been mentioned, the known concepts for soldering large-area components—having a diameter of greater than or equal to 4 mm—have the aim of achieving, by a suitable choice of contacting materials (W, Mo), the least possible differences between the various coefficients of thermal expansion in order to keep thermal stresses low. However, these concepts cannot be transferred to the "recessed-gate" components with their extremely fine structures since these components are much more sensitive in many regards.

REPRESENTATION OF THE INVENTION

The invention then has the object of creating power semiconductor components having a finely subdivided control structure which can be simply and reliably contacted, particularly on the side of the control structure.

In a power semiconductor component of the type initially mentioned, the object is achieved by the fact that the control structure is divided into several small-area control zones which are spatially separated from each other, and each of the control zones is provided with a separate cathode block applied to the cathode fingers of the respective control zone.

Thus, the core of the invention consists in solving the soldering problems in the case of large-area power semiconductor components having a finely subdivided large-area control structure, by dividing the control structure into smaller control zones which can then be soldered separately by themselves in the conventional manner. Thus, the component is functionally divided into a plurality of smaller part elements which, however, are all accommodated in a common semiconductor substrate and which have anode-side layers in common.

According to a preferred illustrative embodiment of the invention, the control structure is subdivided in such a manner that part elements having a maximum current load carrying capability of less than or equal to 10A.

It is advantageous to select the cathode blocks for the individual control zones from a resistance material, in particular Mosi, for the purpose of electric feedback.

If the power semiconductor component is a FCTh, a cascade circuit of the FCTh and of a MOSFET (*M*etal *O*xide *S*emiconductor *F*ield *E*ffect *T*ransistor) can be implemented in a particularly advantageous manner in accordance with the invention by applying as cathode blocks MOSFET elements of smaller power to the cathode fingers of the individual control zones, the size of the MOSFET elements corresponding to the size of the control zones and the MOSFET elements, together with the part elements of the FCTh formed by the control zones forming the thyristor MOSFET cascade.

Further illustrative embodiments are obtained from the subclaims.

BRIEF DESCRIPTION OF THE DRAWING

In the text which follows, the invention will now be explained in greater detail and described with the aid of illustrative embodiments in conjunction with the drawing, in which:

FIG. 4 shows a preferred illustrative embodiment of the component according to the invention with local thickness reduction of the substrate;

FIG. 5A shows the circuit diagram of an FCTh-MOSFET cascade;

FIG. 5B shows the control zone of a component according to the invention with a directly applied MOSFET element for implementing the cascade circuit according to FIG. 5A; and FIG. 5C shows the top view of the hybrid implementation of the circuit according to FIG. 5A with a power semiconductor component according to the invention.

APPROACHES FOR CARRYING OUT THE INVENTION

Figure 1A:
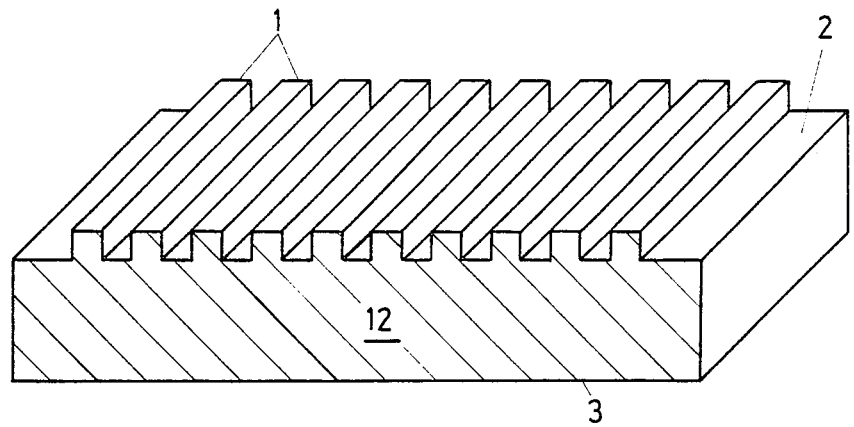
FIG. 1A shows a perspective view of a power semiconductor component having a finely subdivided cathode-side control structure as it is used in the invention.

In FIG. 1A, a power semiconductor component having a so-called "recessed-gate" structure is shown in a perspective view. A semiconductor substrate 12 having an essentially plane anode side 3 exhibits on the opposite cathode side a large-area control structure which consists of a plurality of narrow elongated cathode fingers 1 which project from a lower-lying gate level 2 surrounding the cathode fingers 1. The actual geometric dimensions of the cathode fingers 1 and of the trenches formed between them can be taken in all details for example from the EP-No. A1 0,121,068 quoted above.

The internal layer structure of the component according to FIG. 1A is designed differently depending on whether the component is a GTO thyristor or a FCTh.

Figure 1B:
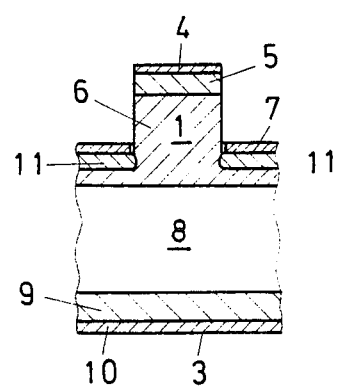
FIG. 1B shows the layer structure of a component according to FIG. 1A for the case of the GTO (in section)

In the case of the GTO thyristor (FIG. 1B) there is first, starting from the anode side 3, a p-doped anode layer 9 which is followed towards the cathode side successively by an n-base layer 8, a p-base layer 7 and, in the upper region of the cathode fingers 1, an n-doped cathode layer 5. In the bottoms of the trenches formed between the cathode fingers 1, a $p^+$-doped gate zone 11 is inserted in each case which carries at the top corresponding metallized gate contacts 7. In comparable manner, an anode contact 10 is applied to the anode side 3 and cathode contacts 4 to the cathode fingers 1. The entire arrangement forms the four-layer structure known from thyristor technology, the cathode-side control structure, however, being constructed in a very special manner.

Figure 1C:
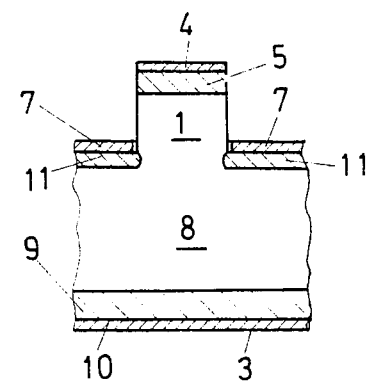
FIG. 1C shows the corresponding layer structure for the case of the FCTh.

In the case of the FCTh (FIG. 1C), a p-base layer is missing. In this case, the n-base layer 8 forms an n-channel zone which projects into the cathode fingers 1 and which, when an appropriate control voltage is applied to the gate contacts 7, can be pinched off.

Layer thicknesses and doping concentrations for both component configurations (GTO and FCTh) can also be taken from EP-No. A1 0 121 068.

Figure 2:
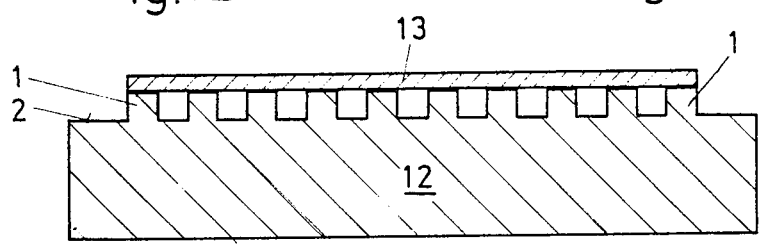
FIG. 2 shows a conventional cathode-side solder contact.

If the component according to FIG. 1A were then to be constructed in conventional manner and contacted by soldering at the cathode side, an arrangement as that shown in FIG. 2 would result: a one-piece continuous cathode block 13 is soldered to the cathode fingers 1 of the semiconductor substrate 12. It can be directly seen from the Figure that in the case of large-area control structures (diameter greater than or equal to 4 mm) and the not negligible differences in the coefficients of expansion of substrate material (Si) and stamp material (Mo or W) stresses occur during thermal cycles which place a particular high mechanical load on the narrow cathode fingers 1.

Figure 3:
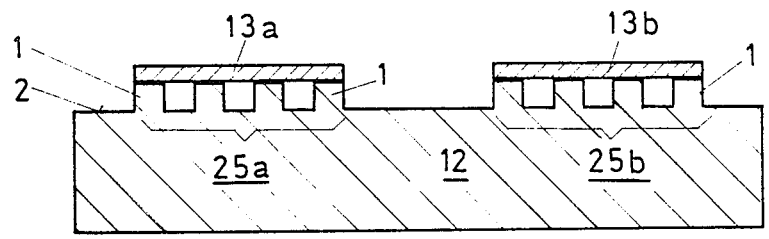
FIG. 3 shows an example of a solder contact according to the invention.

To prevent this from happening, the entire large-area control structure is divided in accordance with the invention, as shown in the example of FIG. 3, into a plurality of small-area control zones 25a, 25b, that is to say in each case a particular number of cathode fingers 1 is combined into groups.

The control zones 25a, 25b, separated from one another by a wider gate region of preferably about 1 mm, are connected at the top of their cathode fingers 1 in conventional soldering technique with corresponding individual cathode blocks 13a, 13b so that within the semiconductor substrate 12 of the overall component, small-area part elements are created in accordance with the control zones 25a, 25b, in the case of which part elements the feared thermal stresses are limited in their size to a harmless magnitude due to the soldered-on cathode blocks 13a, 13b.

After the cathode blocks 13a, 13b have been soldered on, the individual part elements can be electrically connected to one another by conventional wire bonding or—as shown by a pressure contact 26 in FIG. 4—by pressure contacting.

The control structure is preferably subdivided into the individual control zones 25a, 25b in such a manner that part elements having a current-carrying capability of less than or equal to 10A are produced. This corresponds to geometric dimensions of the associated control zones which are uncritical with respect to the thermal stresses. In the embodiment of the component as FCTh, the individual control zones or part elements have an area of about $3\times3$ mm$^2$ or smaller with this dimensioning.

The dividing of the control structure in accordance with the invention into a plurality of smaller control zones according to FIG. 3 provides the possibility of a further advantageous development of the component as is shown in FIG. 4. The part elements created by the spatial separation of the control zones 25a, 25b can be optimized in their electrical characteristics, particularly in the conduction characteristic, by the fact that the thickness of the semiconductor substrate 12 is clearly reduced in the active region.

In the case of large-area components, this is not easily possible because a large-area reduction in the substrate thickness allows the substrate to become mechanically too sensitive. In the present case, however, it is sufficient because of the spatially separated part elements, to reduce the thickness of semiconductor substrate 12 locally, that is to say only in the regions of the respective part elements, by corresponding deep etching trenches 14a, 14b, inserted from the anode side 3. Between the etching trenches 14a, 14b, ribs having the original thickness are then retained which ensure unchanged mechanical strength.

As already mentioned, the part elements in a variant of the component according to the invention can be electrically connected via the cathode blocks 13a, 13b by mean: of the pressure contact 26 shown in FIG. 4 which is pressed onto the semiconductor substrate 12 with sufficient contact pressure P in the direction of the arrow.

In addition, it is advantageous to construct the cathode blocks 13a, 13b of a suitable resistance material, in particular MoSi. In this manner, an integrated electric feedback of the individual part elements is obtained which has as a consequence a uniform load distribution and the prevention of thermal runaway. A FCTh fed back in this manner exhibits the following data:
voltage drop across the feedback under full load: 0.2 V
subdivision into 10A part elements of $3\times3$ mm$^2$ each forward resistance of the part element resistance: 20 mΩ.

Subdividing the control structure of the power semiconductor component into a plurality of separate control zones in accordance with the invention finally enables a so-called cascade circuit, known per se, of a FCTh and a power MOSFET to be implemented in a particularly advantageous manner. The corresponding basic circuit diagram is shown in FIG. 5A.

The entire unit identified by the dashed boundary contains between an anode connection 15 and a cathode connection 21 the series circuit of a FCTh 16 and of a MOSFET 18. The gate of the FCTh 16 is connected via a parallel circuit of a capacitor 20 and a Zener diode 19 to the cathode connection 21. The gate of the MOSFET 18 is brought out as gate connection 17. The cathode circuit described is characterized by particularly advantageous switching characteristics.

In the previous cascode circuit concepts, a series circuit of two individual elements (FCTh and MOSFET) was provided which, for example, were spatially adjacently arranged and contacted by bonding wires. This construction, however, makes high demands on the homogeneity of the components if currents above 50A at 1 kV are to be switched. For the rest, production of correspondingly large high-power MOSFETs is considerably more complex than the production of smaller elements.

A solution to these problems can now be achieved by means of the power semiconductor component according to the invention in the form of the FCTh. This is done in such a manner that small MOSFET elements 23 are either directly soldered as cathode blocks for the control zones onto the cathode fingers 1 arranged in groups in the control zones 23a, b as shown in FIG. 5B, are bonded to an intermediate block 27 of appropriate size which consists, for example, of Cu, Mo or W and, in turn, is soldered to the cathode fingers 1. In this manner, a direct electrical connection between the part elements of the FCTh and the MOSFET elements 23 is achieved. The other connections at the MOSFET element are then produced, for example, by bonded connection wires 22.

Each part element of the FCTh is here again designed for a maximum current of up to 10A and separated from the adjacent part elements by a wider gate region of about 1 mm. Metal is vapor deposited onto the groups of the cathode fingers through a mask in such a manner that they remain electrically isolated from each other. The FCTh is soldered with its anode side 3 in conventional technique for example onto a Cu-coated $Al_2O_3$ substrate. The MOSFET elements 23 are bonded to the groups of cathode fingers 1 for example by means of the so-called "die-bonding".

FIG. 5C shows a top view of a hybrid FCTh—MOSFET cascade constructed in this technique and designed for about 100A. The semiconductor substrate 12 is soldered onto the ceramic substrate, now shown, with an anode connection 15 which laterally projects. On the cathode side, a total of 10 separate control zones are arranged within an annular edge termination 24 which define FCTh part elements having a current-carrying capability of about 10A in each case and are covered by the MOSFET elements 23a, ..., 23k lying above them.

The MOSFET elements 23a, ..., 23k are connected by means of connecting wires 22 of Al in the so-called "multiple stitch" technique to, on the one hand, a conductor area serving as gate connection 17 and, on the other hand, to a conductor area serving as cathode connection 21. The Zener diode 19 can be mounted on the cathode connection 21 as individual element in the manner shown. This correspondingly applies to the capacitor (20 in FIG. 5A) acting as switching-on capacitance which is here divided into two capacitors 20a and 20b to achieve an improved current distribution.

The exemplary arrangement shown in FIG. 5A–C has a whole number of advantages:

Feedback of the small FCTh part elements due to the internal resistances of the MOSFET elements in the ON condition;

current limiting by the pentode characteristic of the MOSFET elements with good current distribution to the individual part elements; from this follows high resistance against switching failure;

implementation of cascade circuits possible almost without upper limit for maximum currents;

use of inexpensive commercially available MOSFET elements;

simple structure;

good distribution of the power loss;

low inductance structure (rapid switching);

combination with local thickness reduction due to deeply-etched anode possible (FIG. 4), and protection of the drive electronics by means of high-load carrying FCTh gate contacting.

Overall, the invention provides a power semiconductor component in which reliable cathode-side contacting is made possible by simple measures even with very high powers and thus large substrate areas and which enables and favors combination with other highly advantageous measures (deeply-etched anode or FCTh - MOSFET cascade).

We claim:

1. A power semiconductor device, comprising:
  a plurality of differently doped layers which are arranged in a semiconductor substrate between an anode and a cathode;
  on the cathode side, a gate cathode structure comprised of a plurality of narrow cathode fingers and a gate plane, whereby said cathode fingers project over and are separated from each other by said gate plane thus forming a large-area recessed gate control structure, said control structure having an area determined by a diameter of greater than or equal to 4 mm;
  said control structure being divided into a plurality of small-area control zones which are spatially separated from each other and each comprise a plurality of said cathode fingers, thereby dividing said device into a plurality of thyristor elements each with a load carrying capability of less than or equal to 10A;
  each of said control zones being provided with a separate cathode block covering the whole area of said control zone;
  each of said cathode blocks being soldered on and thereby electrically connecting all cathode fingers of each respective control zone; and
  each of said cathode blocks consisting of a high resistance material and thereby acting as an electrical feedback for the respective thyristor elements.

2. The power semiconductor device according to claim 1, wherein said high resistance material is MoSi.

3. The power semiconductor device according to claim 2, wherein:

said plurality of differently doped layers comprises a p-doped anode layer, an n-base layer, a p-base layer and an n-doped cathode layer; and said device exhibits the structure of a gate-turn-off (GTO) thyristor.

4. The power semiconductor device according to claim 2, wherein:

said plurality of differently doped layers comprises a p-doped anode layer, an n-base layer acting as a channel layer and an n-doped cathode layer, and said device exhibiting the structure of a field-controlled thyristor (FCTh).

5. A power semiconductor device, comprising:

a plurality of differently doped layers which are arranged in a semiconductor substrate between an anode and a cathode, said plurality of differently doped layers comprising a p-doped anode layer, an n-base layer acting as a channel layer and an n-doped cathode layer and said device exhibiting the structure of a field-controlled thyristor (FCTh);

on the cathode side, a gate cathode structure with a plurality of narrow cathode fingers and a gate plane, whereby said cathode fingers project over and are separated from each other by said gate plane thus forming a large-area recessed gate control structure, said control structure having an area determined by a diameter of greater than or equal to 4 mm;

said control structure being divided into a plurality of small-area control zones which are spatially separated form each other and each comprise a plurality of said cathode fingers, thereby dividing said device into a plurality of thyristor elements with a load carrying capability of less than or equal to 10A;

each of said control zones being provided with a separate cathode block covering the whole area of said control;

each of said cathode blocks being soldered on and thereby electrically connecting all cathode fingers of each respective control zone; and each of said cathode blocks comprising a low-power MOSFET element, thereby forming a thyristor-MOSFET cascade circuit together with the respective thyristor elements.

6. The power semiconductor device according to claim 5, wherein:

each of said cathode blocks further comprises an intermediate block arranged between said MOSFET element and said cathode fingers; and said MOSFET element is bonded to said intermediate block.

7. The power semiconductor device according to claim 6, wherein said intermediate block consists of a metal selected from the group consisting of Cu, Mo and W.

* * * * *